United States Patent
Mehta et al.

[19]

[11] Patent Number: 5,880,608
[45] Date of Patent: Mar. 9, 1999

[54] PULSED DOMINO LATCHES

[75] Inventors: Gaurav G. Mehta, San Jose; David Harris, Stanford; S. Deo Singh, Fremont, all of Calif.

[73] Assignee: Intel Corporation, Santa Clara, Calif.

[21] Appl. No.: 774,261

[22] Filed: Dec. 27, 1996

[51] Int. Cl.[6] .......................... H03K 19/00; H03K 19/096
[52] U.S. Cl. .................. 326/93; 326/121; 326/98
[58] Field of Search ................................. 326/93, 98, 95, 326/96, 97, 121

[56] References Cited

U.S. PATENT DOCUMENTS

| | | | |
|---|---|---|---|
| 3,601,627 | 8/1971 | Booher ........................................ | 326/97 |
| 4,827,160 | 5/1989 | Okano ........................................ | 326/97 |
| 4,849,658 | 7/1989 | Iwamura et al. ........................... | 326/93 |
| 5,378,942 | 1/1995 | Wu et al. .................................... | 326/97 |
| 5,453,708 | 9/1995 | Gupta et al. ............................... | 362/98 |
| 5,517,136 | 5/1996 | Harris et al. . | |
| 5,638,009 | 6/1997 | Sutherland et al. ....................... | 326/83 |

OTHER PUBLICATIONS

Donald Draper, et al. *"An X86 Microprocessor with Multimedia Extensions,"* Proceedings From IEEE, Feb. 7, 1997, pp. 172–173.

"Flow–Through Latch and Edge–Triggered Flip–Flop Hybrid Elements", International Solid State Circuits Conference, Feb. 9, 1996, pp. 138–139.

*Primary Examiner*—Jon Santamauro
*Assistant Examiner*—Don Phu Le
*Attorney, Agent, or Firm*—Blakely, Sokoloff, Taylor & Zafman LLP

[57] ABSTRACT

The present invention is a novel method of interfacing static logic to domino logic. A static logic block is connected to one input of a domino evaluation tree. The domino evaluation tree operates only during a brief window of time, while an evaluation control block is ON. Since the input to the domino gate only must be stable during this brief window of time, there is no need to latch the output of the static logic.

31 Claims, 6 Drawing Sheets

PULSED DOMINO LATCHES

FIELD OF THE INVENTION

The present invention relates to digital logical circuits, and more specifically, to logic circuits designed for high speed synchronous operation, such as domino circuits.

BACKGROUND OF THE INVENTION

Performance goals of processors increase in every generation and progressively more sophisticated architectures are required to implement their complex functions. Advanced architectures require long pipelines which increase the number of latches used to interface pipeline stages. These latches consume considerable amounts of power and area.

Domino circuits increase the performance of logic circuits by precharging a series of logic gates during a first clock phase, or precharge phase, and evaluating the intended logic function during the next clock phase, or evaluation phase. Domino circuits have three sources of overhead which reduce performance: latches, clock skew, and the inability to borrow time across clock boundaries. Opportunistic time borrowing (OTB) domino circuits improve performance by eliminating these three sources of overhead for interfacing two phases of domino circuits. A full description of OTB domino circuits can be found in U.S. Pat. No. 5,517,136 issued May 14, 1996. However, OTB domino is not applicable to interfacing static logic to domino logic. Interfacing static logic to domino logic is expensive in terms of time, power consumption, and area. One of the constraints of domino logic is that there can be no false transition or valid high to low transition at its input while the domino logic operates. Such a high to low transition may cause an erroneous output. Glitches in the output of the static logic block may accidentally trigger domino circuits in this way. Therefore, in the prior art, a latch is required to hold a stable input from the static logic to the domino logic.

Figure 1A:
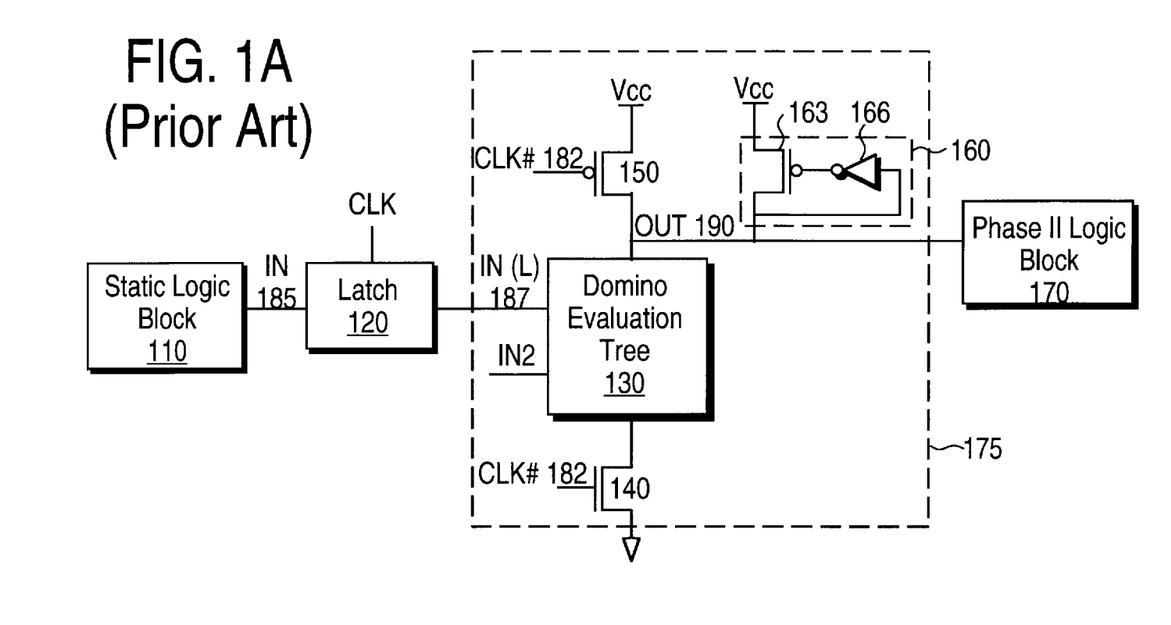
FIG. 1A is a block diagram of a prior art interface between a static logic block and domino logic block.

FIG. 1A illustrates a block diagram of a prior art interface between a static logic block 110 and a domino evaluation tree 130. The domino evaluation tree 130 is a logic block made of N-type MOSFET transistors which may evaluate one of a number of functions. For example, the domino evaluation tree 130 may implement a NAND or NOR function. The method of implementing such functions in NMOS is well known in the art. The output of the static logic block 110 is latched by the latch 120 in order to provide a stable input to the domino evaluation tree 130.

FIG. 1A shows one input, IN, from the static logic block 110 interfaced to the domino evaluation tree 130 by latch 120. However, the domino evaluation tree 130 may have more than one input from a static logic interfaced in a similarly. The domino gate 175 is clocked by the complimentary clock signal, CLK# 182. The domino gate 175 includes the domino evaluation tree 130, an NMOS evaluation transistor 140, a PMOS precharge transistor 150, and a PMOS sustainer 160. Domino evaluation tree 130 is connected to the NMOS evaluation transistor 140, which only allows evaluation while CLK# signal 182 is high. The domino evaluation tree 130 is also connected to the PMOS precharge transistor 150, which pulls the OUT signal 190 high during the precharge phase, while CLK# signal 182 is low.

Further, the output of the domino evaluation tree 130 is coupled to a PMOS sustainer 160. The PMOS sustainer 160 consists of an inverter 166, with the output of the inverter 166 coupled to the gate of a PMOS device 163. This PMOS device 163 is coupled between the operating supply and the output of the domino evaluation tree 130. The function of the PMOS sustainer 160 is to keep the output high—to keep it from floating—if the domino evaluation tree does not pull it low. Finally, the output of the domino gate 175 is an input to the Phase II logic block 170.

Figure 1B:
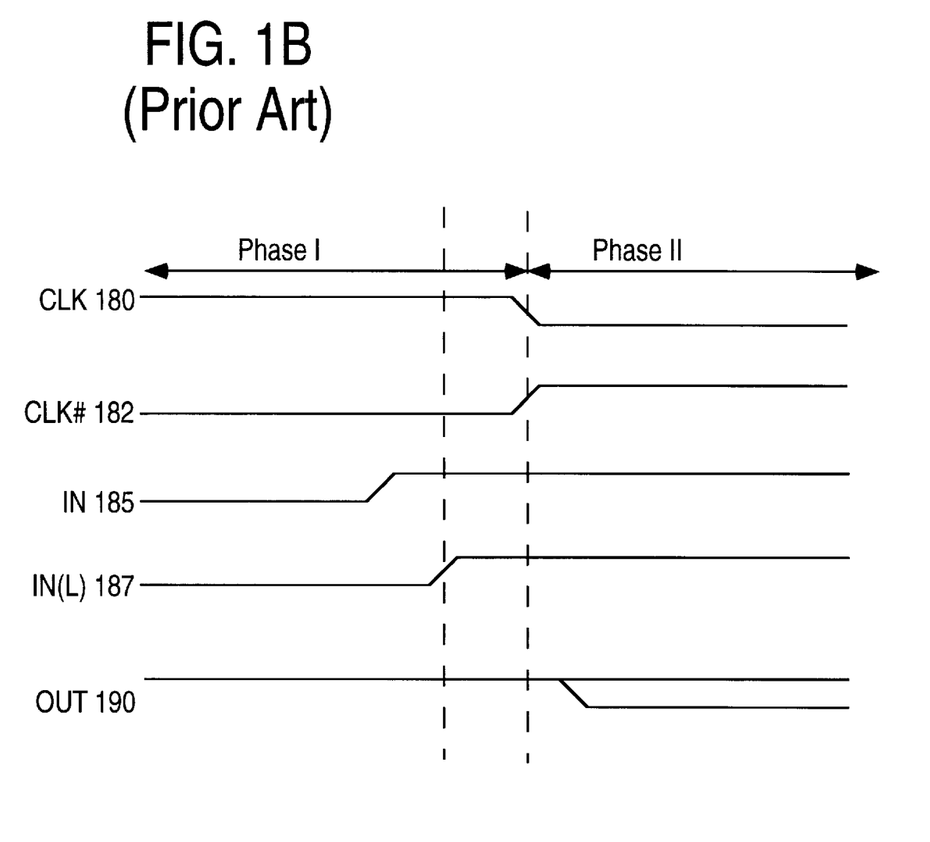
FIG. 1B is a timing diagram of the signals utilized in the prior art method of interfacing static logic block and domino logic block.

FIG. 1B represents the timing diagram of the circuit illustrated in FIG. 1A. The IN signal 185 is input to the latch 120 and the output of the latch 120 is the IN(L) signal 187. The IN signal 185 becomes valid at least $t_s$ prior to the end of Phase I. The time $t_s$ is the setup time of the latch 120. The IN(L) signal 187 must become valid before the start of Phase II in order for the IN(L) signal 187 to be stable when the domino evaluation tree 130 operates. The output signal, OUT 190, is the output of the domino gate 175 and becomes valid during Phase II.

The latch 120 performs no logic, but only holds a stable input for the domino gate 175 during Phase II. The latch 120 adds the propagation delay through the latch or the setup time of the latch to the critical path. In addition, the latch 120 increases the area and power consumption of the circuit.

Thus it can be seen that an improved interface from static to domino logic, which eliminates the need for a latch, is desirable.

BRIEF SUMMARY OF THE INVENTION

The present invention is a novel method of interfacing static logic to domino logic. A static logic block is connected to one input of a domino evaluation tree. The domino evaluation tree operates only during a brief window of time, while an evaluation control block is ON.

Since the input to the domino gate only must be stable during this brief window of time, there is no need to latch the output of the static logic.

BRIEF DESCRIPTION OF THE DRAWINGS

The present invention is illustrated by way of example, and not by way of limitation, in the figures of the accompanying drawings in which.

DETAILED DESCRIPTION OF THE PREFERRED EMBODIMENT

A method and apparatus for interfacing static logic block to domino logic is described. In the following description, for the purposes of explanation, numerous specific details are set forth in order to provide a thorough understanding of the present invention. It will be apparent, however, to one skilled in the art, that the present invention may be practiced without these specific details. In other instances, well-known structures and devices are shown in block diagram form in order to avoid obscuring the present invention.

A static logic block is connected to one input of a domino evaluation tree. The domino evaluation tree operates only during a brief window of time, while an evaluation control block is ON. Since the input to the domino gate only must be stable during this brief window of time, there is no need to latch the output of the static logic.

Figure 2A:
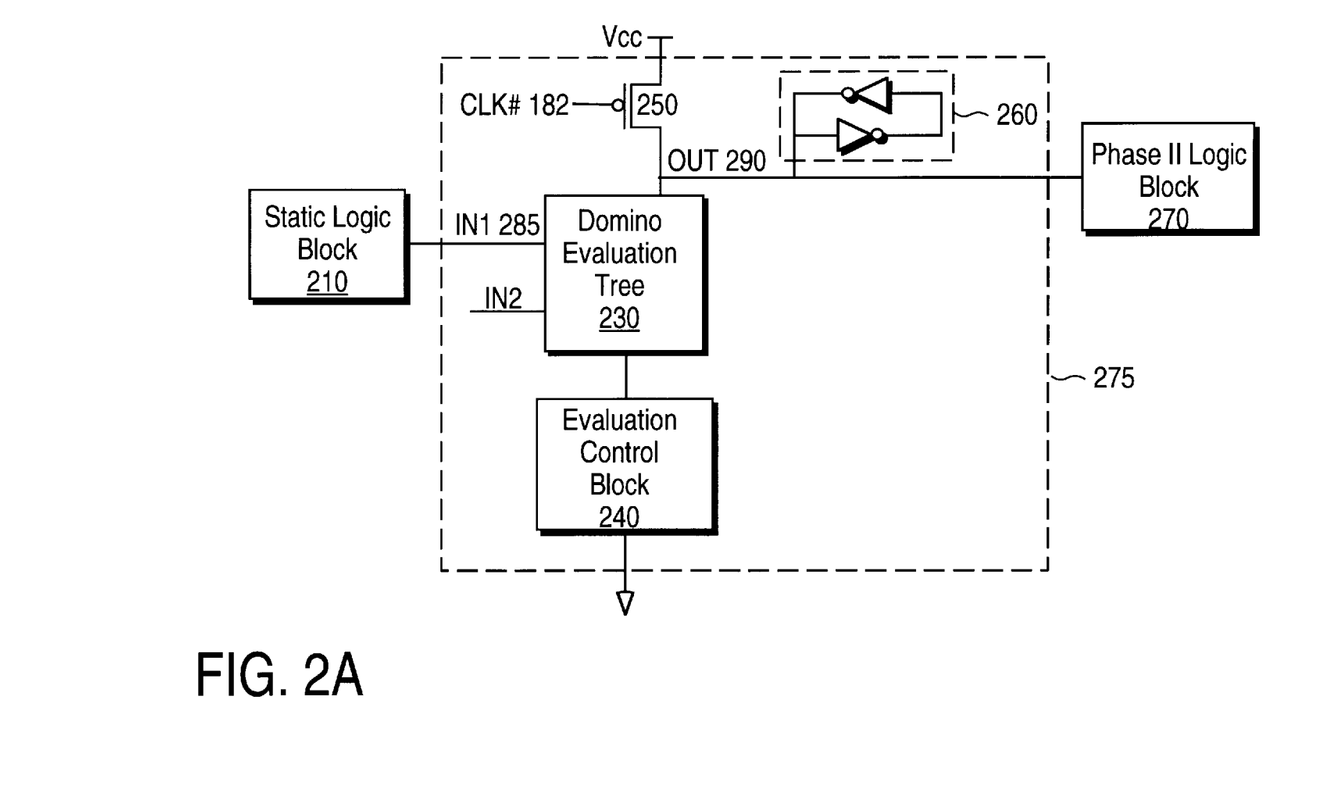
FIG. 2A is a block diagram the interface between static logic block and domino logic block according to the present invention.

FIG. 2A is a block diagram of the present invention illustrating an interface between a static logic block 210 and a domino gate 275. The output of the static logic block 210 is input to domino evaluation tree 230. Static logic is preferred for many functions because it has lower power consumption and simpler design than domino logic implementing an equivalent function. The static logic block 210 can implement any Boolean function.

The domino evaluation tree 230 may implement any one inverting function. For example, the domino evaluation tree 230 may be a NAND, implemented by two N-type metal oxide semiconductor (NMOS) devices in series, having their gates connected to a first input, IN1, and a second input, IN2, respectively.

The output of the static logic block 210, the IN1 signal 285, is an input to the domino evaluation tree 230. In FIG. 2A only one input of the domino evaluation tree 230 is connected to the output of the static logic block 210. It is to be understood that the domino evaluation tree 230 may have a number of inputs, one or more of which may be the outputs of static logic blocks.

The domino gate 275 includes the domino evaluation tree 230, a PMOS precharge transistor 250, an evaluation control block 240, and a full keeper 260. The domino evaluation tree 230 is connected to the PMOS precharge transistor 250, which pulls the OUT signal 290 high during the precharge phase, while CLK# signal 182 is low. The domino evaluation tree 230 is also connected to an evaluation control block 240. The domino evaluation tree 230 operates only when the evaluation control block 240 is ON, that is pulling down, and the CLK# signal 182 is high.

The output, OUT 290, of the domino evaluation tree 230 is prevented from floating by a full keeper 260. In one embodiment, the full keeper 260 includes a pair of cross coupled inverters coupled to the output node of the domino evaluation tree 230. The OUT signal 290 is an input to a Phase II logic block 270. The Phase II logic block 270 may be static logic or domino logic.

Figure 2B:
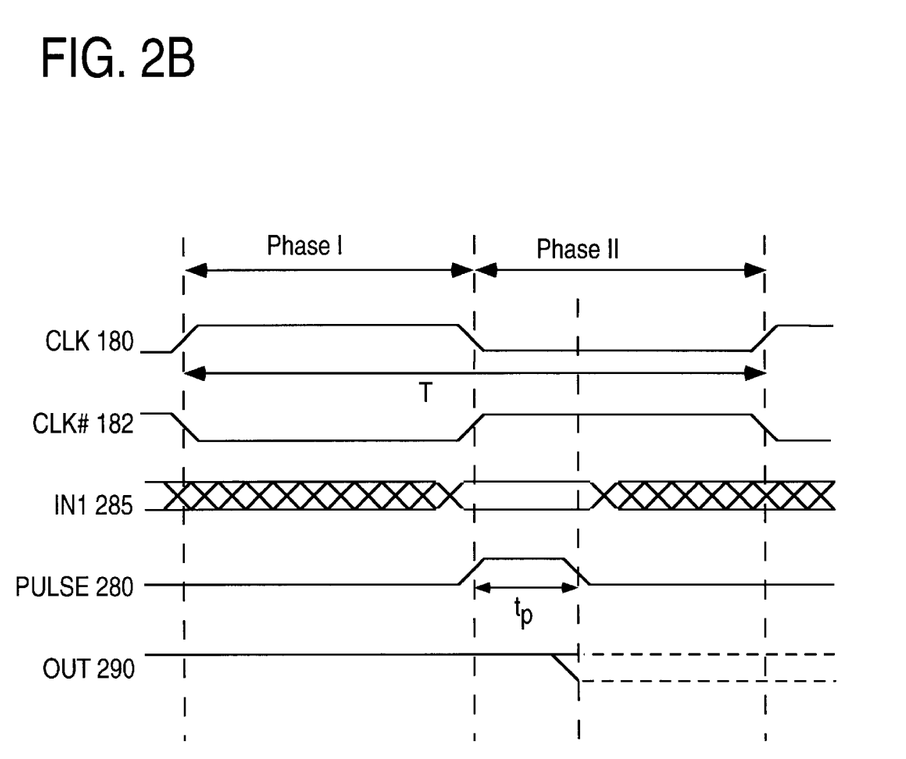
FIG. 2B is a timing diagram of the signals utilized in the interface between static logic block and domino logic block of the present invention.

FIG. 2B is a timing diagram of the signals utilized in the interface of the present invention. The CLK signal 180 is a standard clock having a 50% duty signal. In one embodiment, the frequency of the CLK signal 180 is 500 MHz. The CLK signal 180 may be an integrated circuit's global reference clock signal, which runs at the integrated circuit's internal operating frequency. In FIG. 2B the period of the CLK signal 180 is denoted T.

Phase I is defined as the period during which the CLK signal 180 is high, while Phase II is the period during which the CLK signal 180 is low. Other clock phases are designed to nominally transition in alignment with the CLK signal 180. The dashed vertical lines indicate boundaries between transitions of the various signals. The CLK# signal 182 is the complement of the CLK signal 180.

The clocking scheme of the present invention further includes the PULSE 280, with a width of $t_p$. The PULSE 280 is the period during which the evaluation control block 240 is ON. As can be seen, the PULSE 280 begins substantially synchronously with the rising edge of the CLK# signal 182. However, the end of PULSE 280 is earlier than the falling edge of the CLK# signal 182. In this way, the evaluation control block 240 is only ON during part of Phase II. The width of the PULSE 280, $t_p$, can be adjusted to a variety of values.

The IN1 signal 285 is the output of the static logic block 210, and thus an input to the domino gate 275. The IN1 signal 285 becomes valid before the end of Phase I, and must remain stable while the evaluation control block 240 is ON. The domino evaluation tree 230 operates during $t_p$ and may pull the OUT signal 290 low. After this window of time the OUT signal 290 is maintained by the full keeper 260. In FIG. 2B this is shown as a dashed line. The OUT signal 290 needs to be kept stable beyond $t_p$ because the Phase II logic block 270 operates during all of Phase II.

The width of the PULSE 280 is greater than the maximum required evaluation time of the domino evaluation tree 230, to make certain that the output of the domino evaluation tree 230 is valid. However, the width of the PULSE 280 is less than the minimum contamination delay of the static logic block 210. The minimum contamination delay of the static logic block is the minimum time required for a change in any input of the static logic to propagate to any output of the static logic. Thus, the IN1 signal 285 remains stable during the brief window of time while domino gate 275 is operating. Therefore, the IN1 signal 285 does not need to be latched in the present invention. Eliminating this latch shortens the critical path and saves area and power.

Figure 3A:
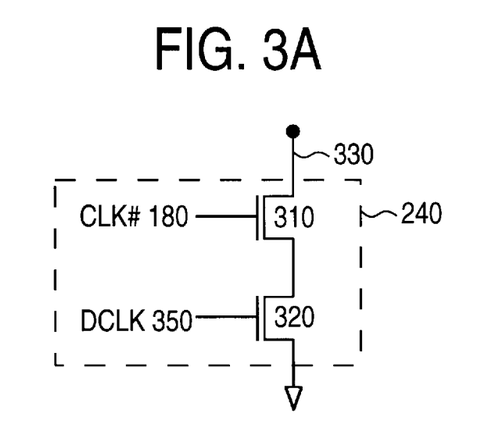
FIG. 3A is a circuit diagram of one embodiment of the evaluation control block of the present invention.
Figure 4A:
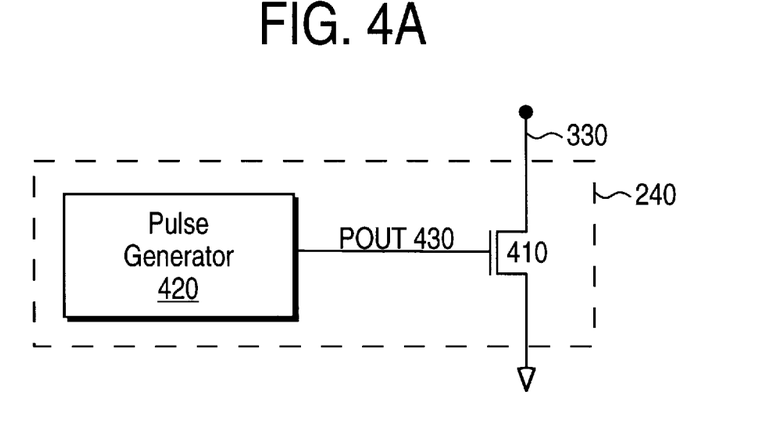
FIG. 4A is a circuit diagram of another embodiment of the evaluation control block of the present invention.

An important element of the present invention is the evaluation control block 240. There are many ways to implement such an evaluation control block 240, two of which are illustrated FIGS. 3A and 4A. FIG. 3A utilizes clock signals which are available in OTB domino circuits. FIG. 4A eliminates a transistor from the pull-down path at the expense of needing a pulse generator.

FIG. 3A is a circuit diagram of one embodiment of the evaluation control block 240. Referring to FIG. 3A, the evaluation control block 240 consists of two N-type MOSFET devices 310 and 320 in series between ground and the output node 330. The first NMOS device 310 is driven by the complimentary clock. CLK# 182, while the second NMOS device 320 is driven by a delayed clock, DCLK 350. The DCLK signal 350 is described in more detail below.

Figure 3B:
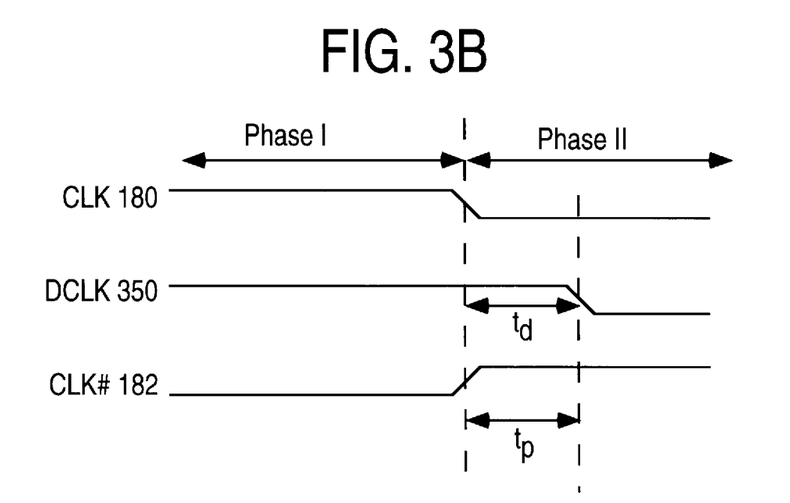
FIG. 3B is a timing diagram of the signals of one embodiment of the evaluation control block of the present invention.

FIG. 3B is a timing diagram of the signals utilized in FIG. 3A. The CLK signal 180 and the CLK# signal 182 are identical to the signals from FIG. 2B, described above. This embodiment of the present invention further includes the DCLK signal 350, a delayed clock. The DCLK signal 350 has a rising edge substantially synchronous with the rising edge of the CLK signal 180. The falling edge of the DCLK signal 350 is delayed with respect to the falling edge of the CLK signal 180. In FIG. 3B the time delay between the falling edge of the CLK signal 180 and the falling edge of the DCLK signal 350 is denoted $t_d$. The DCLK signal 350 is used by OTB domino circuits, thus it is conveniently available for the present invention. For a more detailed description of the generation of the DCLK signal 350 see U.S. Pat. No. 5,517,136. The conditional evaluation window $t_p$, is the time that both CLK# signal 182 and DCLK signal 350 are high. Thus the evaluation control block 240 is ON for a period of $t_p$, starting at the rising edge of the CLK# signal 182 and ending at the falling edge of the DCLK signal 350. Therefore, in this embodiment, $t_p$ equals $t_d$.

FIG. 4A shows an alternative embodiment of the evaluation control block 240, using only one pull-down transistor. An NMOS device 410 is connected between ground and an output node 330. The NMOS device 410 is driven by POUT signal 430, the output of pulse generator 420. Pulse generators are well known in the art.

Figure 4B:
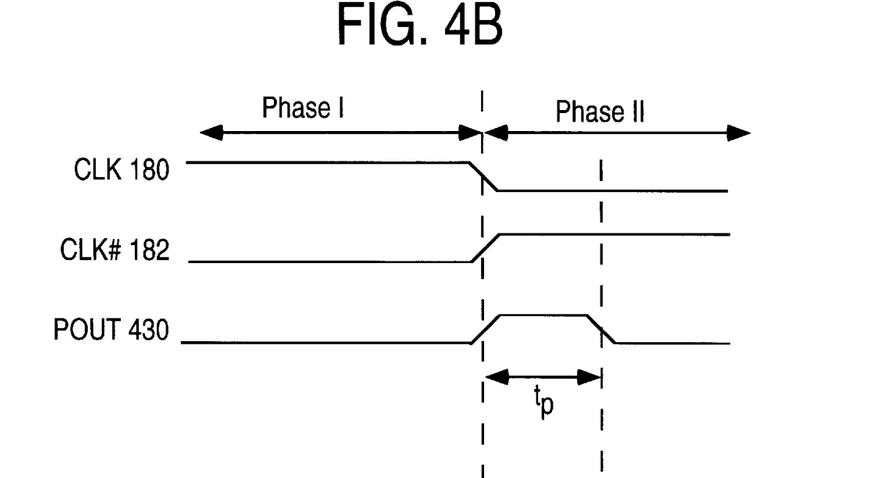
FIG. 4B is a timing diagram of the signals of another embodiment of the evaluation control block of the present invention.

FIG. 4B shows the timing diagram of the signals used in FIG. 4A. The CLK signal 180 and the CLK# signal 182 are identical to the signals from FIG. 2B, described above. The POUT signal 430 is the output of the pulse generator 420, having a width of $t_p$. While POUT signal 430 is high, the evaluation control block 240 is ON.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense. The present invention should not be construed as limited by such embodiments and examples, but rather construed according to the following claims.

What is claimed is:

1. An interface between a static logic block and a domino gate controlled by a clock signal, comprising:
   a domino evaluation tree having an input connected to an output of said static logic block; and
   an evaluation control block;
   said domino evaluation tree evaluating during a window of time less than one half of a clock period of said clock signal while said evaluation control block is on.

2. The interface of claim 1 wherein said evaluation control block is on for a time less than a minimum contamination delay of said static logic block.

3. The interface of claim 1 wherein said evaluation control block is on for a time greater than a maximum evaluation time of said domino evaluation tree.

4. The interface of claim 1 wherein said evaluation control block comprises:
   a first n-channel metal oxide semiconductor field effect transistor (NMOSFET) driven by a complimentary clock; and
   a second NMOSFET driven by a delayed clock, coupled in series with said first NMOSFET.

5. The interface of claim 1 wherein said evaluation control block comprises:
   an n-channel metal oxide semiconductor field effect transistor (NMOSFET); and
   a pulse generator coupled to a gate of said NMOSFET.

6. The interface of claim 1 further comprising a full keeper to prevent an output of said domino evaluation tree from floating after said evaluation control block is no longer on.

7. The interface of claim 6 wherein said full keeper comprises a pair of cross coupled inverters.

8. An interface between a static logic block and a domino gate comprising:
   a domino evaluation tree having an input connected to an output of said static logic block;
   an evaluation control block, said evaluation control block being on for a time less than a minimum contamination delay of said static logic block, said evaluation control block including:
      a first n-channel metal oxide semiconductor field effect transistor (NMOSFET) driven by a complimentary clock, and
      a second NMOSFET driven by a delayed clock, in series with said first NMOSFET, said evaluation control block being on during a window of time less than one half of a clock period of the complementary clock; and
   said domino evaluation tree operating while said evaluation control block is on.

9. An interface between a static logic block and a domino gate comprising:
   a precharged node controlled by a clock signal;
   a domino evaluation tree having an input connected to an output of said static logic block;
   an evaluation control block including:
      an n-channel metal oxide semiconductor field effect transistor (NMOSFET), and
      a pulse generator coupled to a gate of said NMOSFET to generate a pulse with a period less than one half of a clock period of said clock signal, the evaluation control block being on during the pulse;
   said domino evaluation tree operating while said evaluation control block is on; and
   a full keeper for preventing an output of said domino evaluation tree from floating after said evaluation control block is off, said full keeper including a pair of cross coupled inverters.

10. The interface of claim 9 wherein said input of said domino evaluation tree is directly connected to the output of said static logic block.

11. An interface between a static logic block and a domino gate comprising:
    a clock signal;
    a complimentary clock signal, said complimentary clock signal being a complement of said clock signal;
    a delayed clock signal, said delayed clock signal being delayed with respect to said clock signal; and
    a domino evaluation tree, having an input connected to an output of said static logic block, said domino evaluation tree operating during a window of time while said complimentary clock signal and said delayed clock signal are high.

12. The interface of claim 11 wherein said window of time is less than one half of a period of said clock signal.

13. The interface of claim 12 wherein said window of time is less than a minimum contamination delay of said static logic block.

14. The interface of claim 12 wherein said window of time is greater than a maximum evaluation time of said domino evaluation tree.

15. The interface of claim 11 wherein said window of time is determined by an evaluation control block comprising:
    a first n-channel metal oxide semiconductor field effect transistor (NMOSFET) driven by said complimentary clock signal; and
    a second NMOSFET driven by said delayed clock signal, coupled in series with said first NMOSFET.

16. The interface of claim 11 further comprising a full keeper to prevent an output of said domino evaluation tree from floating after said window of time.

17. The interface of claim 16 wherein said full keeper comprises a pair of cross coupled inverters.

18. An interface between a static logic block and a domino gate comprising:

a precharged node controlled by a clock signal;

a pulse, said pulse being shorter than one half of a period of said clock signal; and a domino evaluation tree, having an input connected to an output of said static logic block, said domino evaluation tree operating during said pulse.

19. The interface of claim 18 wherein said pulse is less than one half of a period of said clock signal.

20. The interface of claim 19 wherein said pulse is less than a minimum contamination delay of said static logic block.

21. The interface of claim 19 wherein said pulse is greater than a maximum evaluation time of said domino evaluation tree.

22. The interface of claim 18 wherein said pulse is determined by an evaluation control block comprising:

an n-channel metal oxide semiconductor field effect transistor (NMOSFET); and a pulse generator coupled to a gate of said NMOSFET.

23. The interface of claim 18 further comprising a full keeper to prevent an output of said domino evaluation tree from floating after said pulse.

24. The interface of claim 23 wherein said full keeper comprises a pair of cross coupled inverters.

25. A method of interfacing a static logic and a domino logic controlled by a clock signal, said method comprising the steps of:

evaluating a first function implemented by a static logic block;

turning on an evaluation control block during a window of time less than one half of a clock period of said clock signal; and evaluating a second function implemented by a domino evaluation tree while said evaluation control block is on.

26. The method of claim 25 further comprising the step of turning off said evaluation control block, wherein said evaluation control block is on for a time less than a minimum contamination delay of said static logic block.

27. The method of claim 25 further comprising the step of turning off said evaluation control block, wherein said evaluation control block is on for a time greater than a maximum evaluation time of said domino evaluation tree.

28. The method of claim 25 wherein said step of turning on said evaluation control block comprises the steps of:

turning on a first n-channel metal oxide semiconductor field effect transistor (NMOSFET) when a complimentary clock is high; and turning on a second NMOSFET when a delayed clock is high, said second NMOSFET coupled in series with said first NMOSFET, said first NMOSFET and said second NMOSFET comprising said evaluation control block.

29. The method of claim 25 wherein said step of turning on said evaluation control block comprises the steps of:

generating a pulse using a pulse generator; and turning on an n-channel metal oxide semiconductor field effect transistor (NMOSFET), by coupling said pulse generator to a gate of said NMOSFET, said pulse generator and said NMOSFET comprising said evaluation control block.

30. The method of claim 25 further comprising the step of preventing an output of said domino evaluation tree from floating after said evaluation control block is turned off, using a full keeper.

31. The method of claim 30 wherein said full keeper comprises a pair of cross coupled inverters.

* * * * *